(12) United States Patent
Kuo et al.

(10) Patent No.: US 7,982,219 B2
(45) Date of Patent: Jul. 19, 2011

(54) PIXEL ARRAY

(75) Inventors: Jing-Tin Kuo, Taipei (TW); Kuo-Hsien Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 138 days.

(21) Appl. No.: 12/575,483

(22) Filed: Oct. 8, 2009

(65) Prior Publication Data

US 2011/0017994 A1    Jan. 27, 2011

(30) Foreign Application Priority Data

Jul. 22, 2009   (TW) ................................ 98124740 A

(51) Int. Cl.
  *H01L 29/04*    (2006.01)
(52) U.S. Cl. ............ 257/59; 438/34; 438/586; 257/347; 257/E33.053; 257/E27.112; 257/E29.043; 345/87; 345/88; 345/89; 345/90; 345/91; 349/37; 349/48; 349/143; 349/187
(58) Field of Classification Search .................... 438/34, 438/586; 257/59, 347, E27.211, E27.112, 257/E29.043, E21.411, E33.053; 345/87–92, 345/145; 349/37, 48, 143, 187
See application file for complete search history.

(56) References Cited

U.S. PATENT DOCUMENTS

| | | | | |
|---|---|---|---|---|
| 6,014,193 A | * | 1/2000 | Taira et al. | 349/73 |
| 6,028,577 A | * | 2/2000 | Sakamoto | 345/92 |
| 6,075,505 A | * | 6/2000 | Shiba et al. | 345/87 |
| 6,259,504 B1 | * | 7/2001 | Shin et al. | 349/144 |
| 6,404,410 B1 | * | 6/2002 | Shirae | 345/55 |
| 6,583,777 B2 | * | 6/2003 | Hebiguchi et al. | 345/92 |
| 6,982,690 B2 | * | 1/2006 | Lee et al. | 345/87 |
| 7,286,107 B2 | * | 10/2007 | Lee et al. | 345/92 |
| 7,471,274 B2 | * | 12/2008 | Kim | 345/88 |
| 7,675,498 B2 | * | 3/2010 | Ku | 345/90 |
| 7,750,885 B2 | * | 7/2010 | Park et al. | 345/100 |

(Continued)

FOREIGN PATENT DOCUMENTS

CN      101276109      10/2008

OTHER PUBLICATIONS

"First Office Action of China Counterpart Application", issued on Oct. 25, 2010, p. 1-p. 4, in which the listed reference was cited.

*Primary Examiner* — N Drew Richards
*Assistant Examiner* — Ankush k Singal
(74) *Attorney, Agent, or Firm* — Jianq Chyun IP Office

(57) ABSTRACT

A pixel array includes scan lines, data lines, and pixels. Each pixel arranged in the $n^{th}$ row includes a first sub-pixel, a second sub-pixel, and a third sub-pixel. In the first sub-pixel, a first gate and a first drain of a first transistor are connected to the $(n-1)^{th}$ scan line and a first pixel electrode, respectively. In the second sub-pixel, a second gate of a second transistor is connected to the $n^{th}$ scan line, and a second drain is connected to a second pixel electrode and a first source of the first transistor. In the third sub-pixel, a third gate of a third transistor is connected to the $(n+1)^{th}$ scan line, a third drain is connected to a third pixel electrode and a second source of the second transistor, and a third source is connected to one of the data lines.

12 Claims, 12 Drawing Sheets

U.S. PATENT DOCUMENTS

| | | | |
|---|---|---|---|
| 7,764,329 B2* | 7/2010 | Lee | 349/48 |
| 7,796,106 B2* | 9/2010 | Ha | 345/88 |
| 7,880,698 B2* | 2/2011 | Park et al. | 345/82 |
| 7,889,213 B2* | 2/2011 | Baek et al. | 345/690 |
| 2002/0180902 A1* | 12/2002 | Izumi et al. | 349/43 |
| 2003/0197668 A1* | 10/2003 | Song et al. | 345/87 |
| 2003/0218618 A1* | 11/2003 | Phan | 345/629 |
| 2004/0119704 A1* | 6/2004 | Miyajima et al. | 345/204 |
| 2005/0140638 A1* | 6/2005 | Lee et al. | 345/100 |
| 2005/0225523 A1* | 10/2005 | Park | 345/87 |
| 2005/0243045 A1* | 11/2005 | Kim | 345/87 |
| 2006/0145983 A1* | 7/2006 | Lee et al. | 345/92 |
| 2006/0164350 A1* | 7/2006 | Kim et al. | 345/87 |
| 2007/0188432 A1* | 8/2007 | Kwon et al. | 345/92 |
| 2007/0290981 A1* | 12/2007 | Park et al. | 345/100 |
| 2008/0024712 A1* | 1/2008 | Kim | 349/144 |
| 2008/0068516 A1* | 3/2008 | Mori et al. | 348/790 |
| 2008/0117154 A1* | 5/2008 | Yeh | 345/90 |
| 2008/0224978 A1* | 9/2008 | Park | 345/92 |
| 2009/0140253 A1* | 6/2009 | Kasahara | 257/59 |
| 2009/0207119 A1* | 8/2009 | Han et al. | 345/98 |
| 2009/0207328 A1* | 8/2009 | Hur et al. | 349/37 |
| 2010/0053059 A1* | 3/2010 | Kim et al. | 345/99 |
| 2010/0149142 A1* | 6/2010 | Hsu et al. | 345/205 |
| 2010/0157230 A1* | 6/2010 | Cho | 349/143 |
| 2010/0207857 A1* | 8/2010 | Gu et al. | 345/88 |
| 2010/0207862 A1* | 8/2010 | Xu et al. | 345/90 |

* cited by examiner

FIG. 7     400

PIXEL ARRAY

CROSS-REFERENCE TO RELATED APPLICATION

This application claims the priority benefit of Taiwan application serial no. 98124740, filed Jul. 22, 2009. The entirety of the above-mentioned patent application is hereby incorporated by reference herein and made a part of specification.

BACKGROUND OF THE INVENTION

1. Field of the Invention

The application relates to a display array. More particularly, the invention relates to a pixel array.

2. Description of Related Art

To meet requirements of high speed, high efficiency, light weight, and compactness for modern products, electronic parts have been vigorously developed towards the trend of miniaturization. Various mobile electronic devices including notebook computers, cell phones, electronic dictionaries, personal digital assistants (PDAs), web pads, and tablet personal computers (PCs) have become the mainstream. Among image displays of the mobile electronic devices, flat panel displays having superior characteristics, such as great space utilization, high resolution, low power consumption, and no radiation, have been extensively applied nowadays in order to satisfy the demand for miniaturized products.

Generally, a flat panel display mainly contains a display panel and a plurality of driver ICs. The display panel has a pixel array thereon, and pixels in the pixel array are driven by corresponding scan lines and corresponding data lines. In order for the flat panel display to prevail in the market, manufacturers all fervently strive to reduce process costs. Recently, a half source driver technology has been proposed, which mainly arranges the layout on the pixel array for reducing the number of source drivers actually used.

In a conventional half source driver technology, the same data line is mainly used to transmit data signals corresponding to two pixels, and thereby the number of data lines and the number of actually-used source drivers are reduced.

With increasing demands for high quality of the flat panel displays, e.g., high resolution, more source drivers are required. Nonetheless, the source drivers have high cost barrier and high power consumption because signals processed by the source drivers are rather complicated. To satisfy the consumers' need of the flat panel displays with low costs and favorable quality, further reduction of the number of source drivers is likely to better equip the flat panel displays with satisfactory quality and market competitiveness.

SUMMARY OF THE INVENTION

The application is directed to a pixel array having data lines arranged in a zigzag manner. The pixel array is capable of reducing the number of data lines and the number of external source drivers.

In the application, a pixel array including a plurality of scan lines, a plurality of data lines, and a plurality of pixels is provided. The data lines intersect the scan lines. The pixels are connected to the scan lines and the data lines. Each of the pixels arranged in an $n^{th}$ row includes a first sub-pixel, a second sub-pixel, and a third sub-pixel. The first sub-pixel includes a first transistor and a first pixel electrode. A first gate of the first transistor is connected to an $(n-1)^{th}$ scan line, and a first drain of the first transistor is connected to the first pixel electrode. The second sub-pixel includes a second transistor and a second pixel electrode. A second gate of the second transistor is connected to an $n^{th}$ scan line, and a second drain of the second transistor is connected to the second pixel electrode and a first source of the first transistor. The third sub-pixel includes a third transistor and a third pixel electrode. A third gate of the third transistor is connected to an $(n+1)^{th}$ scan line, a third drain of the third transistor is connected to the third pixel electrode and a second source of the second transistor, and a third source of the third transistor is connected to one of the data lines.

According to an exemplary embodiment of the invention, the pixels together connected to one of the data lines are exclusively distributed at the same side of the one of the data lines.

According to an exemplary embodiment of the invention, each of the data lines extends along a column direction in a zigzag manner, and each of the data lines includes a plurality of first conductive lines and a plurality of second conductive lines. The first conductive lines extend along a row direction. The second conductive lines extend along the column direction. The first conductive lines and the second conductive lines are alternately connected.

According to an exemplary embodiment of the invention, a length of each of the first conductive lines is equal to a width of one of the pixels, and a length of each of the second conductive lines is equal to a length of one of the pixels.

According to an exemplary embodiment of the invention, among the pixels arranged in the same column, some of the pixels arranged in odd rows are connected to one of the data lines, and the other pixels arranged in even rows are connected to another one of the data lines.

According to an exemplary embodiment of the invention, the first source is directly connected to the second drain.

According to an exemplary embodiment of the invention, the second source is connected to the third drain through the third pixel electrode.

According to an exemplary embodiment of the invention, in each of the pixels arranged in the $n^{th}$ row, the first pixel electrode, the second transistor, the second pixel electrode, the third transistor, and the third pixel electrode are located between the $n^{th}$ scan line and the $(n+1)^{th}$ scan line, and the first transistor is located between the $n^{th}$ scan line and the $(n-1)^{th}$ scan line.

According to an exemplary embodiment of the invention, each of the scan lines extends along a row direction in a zigzag manner, and each of the scan lines includes a plurality of third conductive lines and a plurality of fourth conductive lines. The third conductive lines extend along the row direction. The fourth conductive lines extend along a column direction. The third conductive lines and the fourth conductive lines are alternately connected. Here, the fourth conductive lines are located between the second sub-pixel and the first sub-pixel in the same pixel. Besides, the fourth conductive lines can also be located between the second sub-pixel and the third sub-pixel in the same pixel.

Based on the above, the pixel array of the invention has the data lines arranged in a zigzag manner, and the sub-pixels connected to the same data line are distributed at the same side of the data line. Through the same data line, different data signals are respectively transmitted to the first, the second, and the third sub-pixels located at the same row. Thereby, the number of data lines and the number of source drivers can be significantly reduced. Moreover, by conducting simple driving methods, the pixel array of the invention can be applied to achieve a dot-inversion driving mode, such that quality products can be fabricated with low costs.

In order to make the aforementioned and other features and advantages of the invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

First Embodiment

Figure 1:
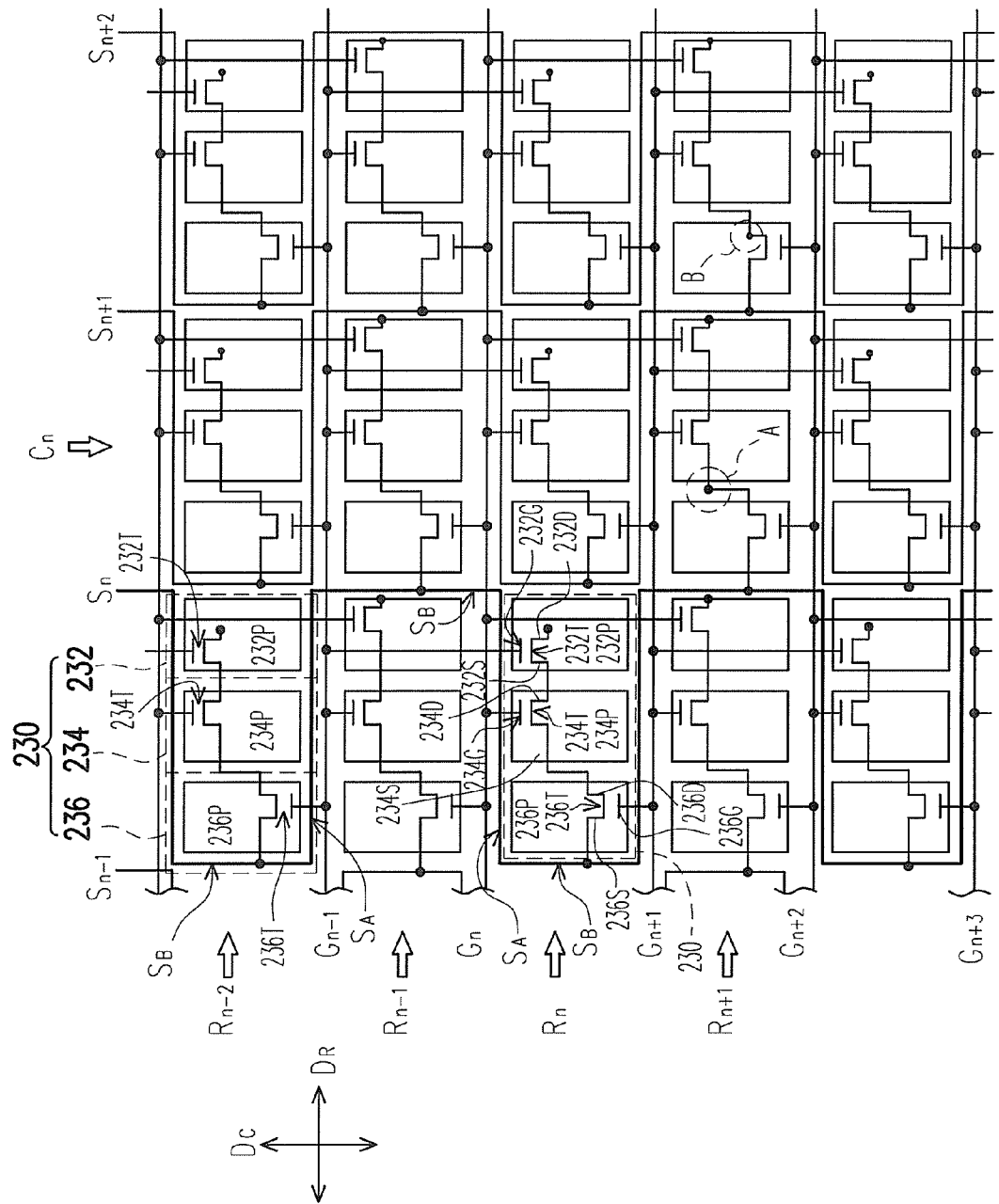
FIG. 1 is a schematic view illustrating a layout of a pixel array according to the invention.

FIG. 1 is a schematic view illustrating a layout of a pixel array according to the invention. As indicated in FIG. 1, the pixel array 200 includes a plurality of scan lines G, a plurality of data lines S, and a plurality of pixels 230. The data lines S intersect the scan lines G. To facilitate illustration, a row direction $D_R$ and a column direction $D_C$ are defined on the pixel array 200, and the row direction $D_R$ is substantially perpendicular to the column direction $D_C$. In the present embodiment, the scan lines G substantially extend along the row direction $D_R$, while the data lines S substantially extend along the column direction $D_C$ in a zigzag manner. In FIG. 1, each of the pixels 230 in the pixel array 200 is connected to the corresponding scan line G and the corresponding data line S. Note that the pixels 230 connected to the same data line S are exclusively distributed at the same side of the data line S in this embodiment. Besides, each of the pixels 230 arranged in the $n^{th}$ row $R_n$ includes a first sub-pixel 232, a second sub-pixel 234, and a third sub-pixel 236, wherein n is a positive integer. That is to say, the first sub-pixel 232, the second sub-pixel 234, and the third sub-pixel 236 in each of the pixels 230 respectively transmit corresponding data signals through the same data line S so as to display images with different gray levels.

Specifically, as indicated in FIG. 1, the pixel 230 arranged in the $n^{th}$ row $R_n$ and electrically connected to the $n^{th}$ data line $S_n$ is taken for example. The first sub-pixel 232 of the pixel 230 includes a first transistor 232T and a first pixel electrode 232P. A first gate 232G of the first transistor 232T is connected to the $(n-1)^{th}$ scan line $G_{n-1}$, a first drain 232D of the first transistor 232T is connected to the first pixel electrode 232P, and a first source 232S of the first transistor 232T is electrically connected to the second sub-pixel 234. The second sub-pixel 234 of the pixel 230 includes a second transistor 234T and a second pixel electrode 234P. A second gate 234G of the second transistor 234T is connected to the $n^{th}$ scan line $G_n$, a second drain 234D of the second transistor 234T is connected to the second pixel electrode 234P and the first source 232S of the first transistor 232T, and a second source 234S of the second transistor 234T is electrically connected to the third sub-pixel 236. The third sub-pixel 236 of the pixel 230 includes a third transistor 236T and a third pixel electrode 236P. A third gate 236G of the third transistor 236T is connected to the $(n+1)^{th}$ scan line $G_{n+1}$, a third drain 236D of the third transistor 236T is connected to the third pixel electrode 236P, and a third source 236S of the third transistor 236T is electrically connected to the $n^{th}$ data line $S_n$.

As for the electrical connection between the second source 234S and the third sub-pixel 236, it should be mentioned that the second source 234S can be directly connected to the third drain 236D as indicated in an area A of FIG. 1. Alternatively, the second source 234S can be directly connected to the third pixel electrode 236P as indicated in an area B of FIG. 1. Certainly, as for the electrical connection between the first source 232S and the second sub-pixel 234, the first source 232S can be directly connected to the second drain 234D, or the first source 232S can be connected to the second transistor 234T through the second pixel electrode 234P. In the invention, the electrical connection between the first drain 232D and the second sub-pixel 234 and the electrical connection between the second drain 234D and the third sub-pixel 236 are not limited.

To be more specific, the pixels 230 connected to the same data line S in the pixel array 200 are located at the same side of the data line S, and the third sub-pixel 236, the second sub-pixel 234, and the first sub-pixel 232 of each of the pixels 230 are sequentially arranged from the data line S along the row direction $D_R$. Note that the data lines S are arranged along the column direction $D_C$ in a zigzag manner according to this embodiment. Therefore, among the pixels 230 in the same column, the pixels 230 located in odd rows and in even rows are connected to different data lines S, respectively. For instance, as shown in FIG. 1, among the pixels 230 arranged in the $n^{th}$ column $C_n$, the pixels 230 in the odd rows are connected to the $(n+1)^{th}$ data line $S_{n+1}$, and the pixels 230 in the even rows are connected to the $n^{th}$ data line $S_n$. Namely, the pixels 230 connected to the $n^{th}$ data line $S_n$ in the column direction $D_C$ are aligned to the pixels 230 connected to the $(n+1)^{th}$ data line $S_{n+1}$. Besides, in the pixels 230 located in the same row, e.g., in the $n^{th}$ row $R_n$, the third sub-pixel 236, the second sub-pixel 234, and the first sub-pixel 232 are deemed as a unit and arranged in a repetitive manner.

As shown in FIG. 1, the third source 236S of the third sub-pixel 236 is connected to one of the data lines S, e.g., the $n^{th}$ data line $S_n$, and therefore the data signal transmitted through the $n^{th}$ data line $S_n$ is passed to the third pixel electrode 236P in the third sub-pixel 236 through the third transistor 236T. In addition, the second source 234S of the second transistor 234T is electrically connected to the third drain 236D of the third transistor 236T. Hence, in the second sub-pixel 234, the data signal transmitted through the $n^{th}$ data line $S_n$ is passed from the third drain 236D of the third sub-pixel 236 or the third pixel electrode 236P to the second pixel electrode 234P through the second transistor 234T. On the other hand, the first source 232S of the first transistor 232T is connected to the second drain 234D of the second transistor 234T. Hence, in the first sub-pixel 232, the data signal transmitted through the $n^{th}$ data line $S_n$ is passed to the first pixel electrode 232P through the third drain 236D of the third transistor 236T, the second drain 234D of the second transistor 234T, and the first transistor 232T. As such, the first sub-pixel 232, the second sub-pixel 234, and the third sub-pixel 236 can share the same data line S to transmit different data signals at different time frames, and thereby the number of data lines S, the number of source drivers, and the fabricating costs can all be significantly reduced.

In practice, when the data signal is written into the first pixel electrode 232P, the voltages respectively at the $(n-1)^{th}$ scan line $G_{n-1}$, the $n^{th}$ scan line $G_n$, and the $(n+1)^{th}$ scan line $G_{n+1}$ are all defined to be at a conductive voltage level $V_{gh}$, such that the first transistor 232T connected to the $(n-1)^{th}$ scan line $G_{n-1}$, the second transistor 234T connected to the $n^{th}$ scan line $G_n$, and the third transistor 236T connected to the $(n+1)^{th}$ scan line $G_{n-1}$ are all turned on. At this time, the corresponding data signal to be transmitted to the first sub-pixel 232 can be passed from the $n^{th}$ data line $S_n$ to the first pixel electrode 232P sequentially through the third sub-pixel 236, the second sub-pixel 234, and the turned-on first transistor 232T.

In the next time frame, the voltage at the $(n+1)^{th}$ scan line $G_{n-1}$ is converted to be at a non-conductive voltage level $V_{gl}$, while the voltages at the $(n-1)^{th}$ scan line $G_{n-1}$ and the $n^{th}$ scan line $G_n$ remain at the conductive voltage level $V_{gh}$. Thereby, the corresponding data signal to be transmitted to the second sub-pixel 234 can be passed from the $n^{th}$ data line $S_n$ to the second pixel electrode 234P sequentially through the third sub-pixel 236 and the second transistor 234T. Thereafter, in the following time frame, the voltages at the $n^{th}$ scan line $G_n$ and the $(n+1)^{th}$ scan line $G_{n+1}$ are converted to be at the non-conductive voltage level $V_{gl}$, while the voltage at the $(n-1)^{th}$ scan line $G_{n-1}$ remains at the conductive voltage level $V_{gh}$. Thereby, the corresponding data signal to be transmitted to the third sub-pixel 236 can be passed from the $n^{th}$ data line $S_n$ to the third pixel electrode 236P through the turned-on third transistor 236T. Thus, the scan lines G on the pixel array 200 can be properly controlled according to the time sequence. As a whole, voltages at the conductive voltage level $V_{gh}$ and the non-conductive voltage level $V_{gl}$ are input to the pixel array 200 according to the predetermined sequence as mentioned above, such that different data signals are transmitted to different sub-pixels through the same data line S for displaying images. The detailed driving mechanism is described hereinafter.

In the layout of the data lines and the pixels, the pixels 230 connected to the same data line S are distributed at the same side of the data line S and substantially arranged along the data line S in the row direction $D_R$ in a zigzag manner. Accordingly, the pixels 230 connected to the same data line S are not aligned in the column direction $D_C$. In this embodiment, each of the data lines S substantially has a sawtooth-shaped layout. Particularly, from a macroscopic perspective, each of the data lines S is substantially arranged along the column direction $D_C$. By contrast, from a microscopic perspective, each of the data lines S mainly contains a plurality of first conductive lines $S_A$ extending along the row direction $D_R$ and a plurality of second conductive lines $S_B$ extending along the column direction $D_C$, for example. Here, the first conductive lines $S_A$ and the second conductive lines $S_B$ are alternately connected to form the data lines S having the sawtooth-shaped layout, as shown in FIG. 1.

To be more specific, in FIG. 1, a length of each of the first conductive lines $S_A$ is equal to a width of one of the pixels 230, i.e., the length of each of the first conductive lines $S_A$ is substantially equal to the total width of the first, the second, and the third sub-pixels 232, 234, and 236. On the other hand, as indicated in FIG. 1, a length of each of the second conductive lines $S_B$ is equal to a length of one of the pixels 230. That is to say, since the first, the second, and the third sub-pixels 232, 234, and 236 are aligned to one another in the row direction $D_R$, the length of each of the second conductive lines $S_B$ in this embodiment is substantially equal to the length of the first sub-pixel 232, the length of the second sub-pixel 234, or the length of the third sub-pixel 236, respectively.

Figure 2A:
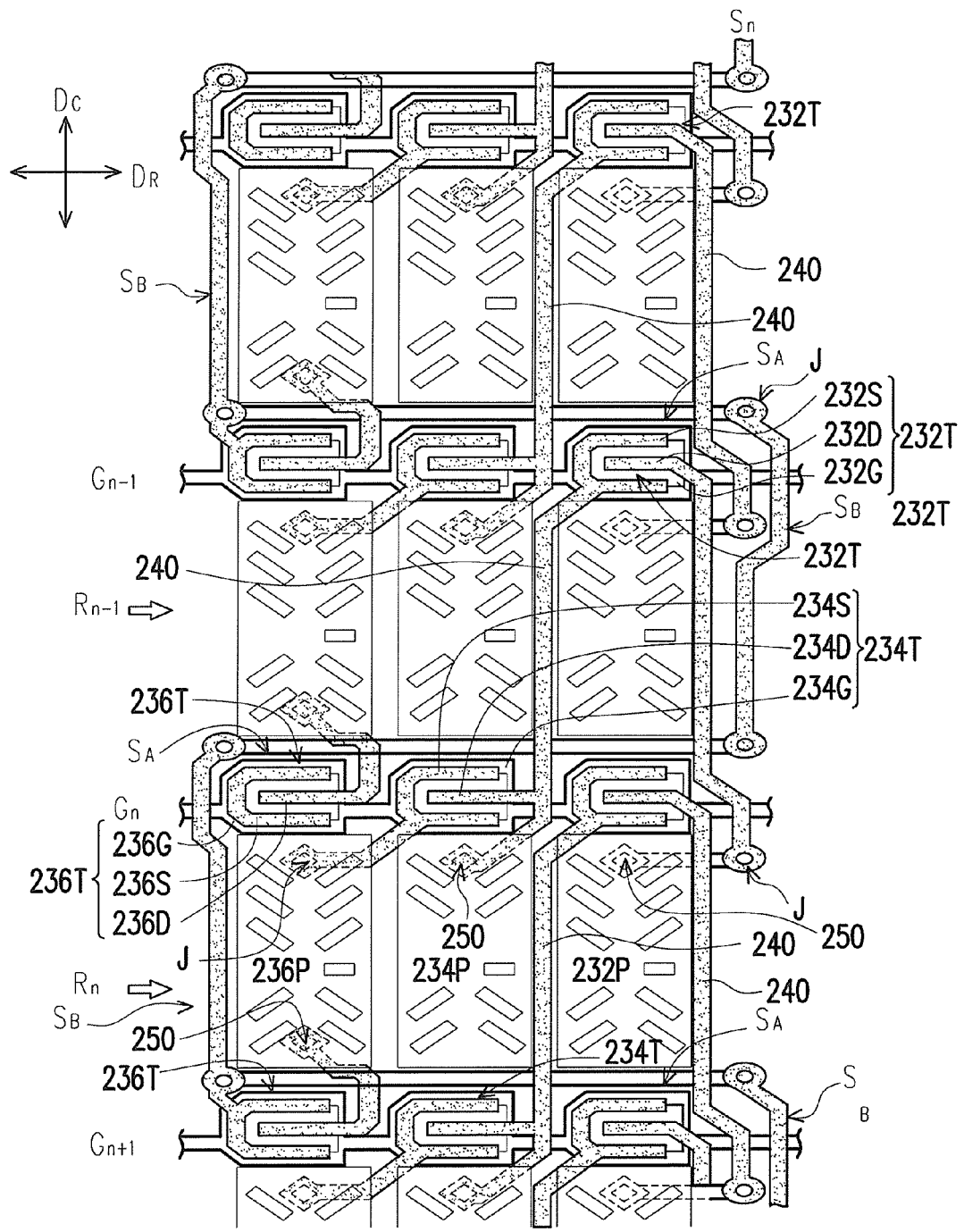
FIG. 2A is a schematic view further illustrating the specific layout of the pixel array depicted in FIG. 1.

FIG. 2A is a schematic view further illustrating the specific layout of the pixel array depicted in FIG. 1. In FIG. 2A, the $n^{th}$ data line $S_n$ includes the first conductive lines $S_A$ extending along the row direction $D_R$ and the second conductive lines $S_B$ extending along the column direction $D_C$, and the first conductive lines $S_A$ and the second conductive lines $S_B$ are alternately connected. Practically, it should be mentioned that the first conductive lines $S_A$ and the scan lines G can be made of the same material, can be formed by performing the same photolithography and etching process (PEP), and can belong to the same first conductive layer. Besides, the second conductive lines $S_B$ and the data lines S can be made of the same material, can be foamed by performing the same PEP, and can belong to the same second conductive layer.

Please refer to FIGS. 1 and 2A. According to this embodiment, in each of the pixels 230 arranged in the $n^{th}$ row $R_n$, the first pixel electrode 232P, the second transistor 234T, the second pixel electrode 234P, the third transistor 236T, and the third pixel electrode 236P are located between the $n^{th}$ scan line $G_n$ and the $(n+1)^{th}$ scan line $G_{n+1}$, and the first transistor 232T is located between the $n^{th}$ scan line $G_n$ and the $(n-1)^{th}$ scan line $G_{n-1}$.

The pixel 230 arranged in the $n^{th}$ row $R_n$ is taken for example. As shown in FIG. 2A, the third sub-pixel 236, the second sub-pixel 234, and the first sub-pixel 232 of the pixel 230 are sequentially arranged from the near (the corresponding second conductive lines $S_B$) to the distant. A first data signal to be input to the first sub-pixel 232 is transmitted to the first pixel electrode 232P of the first sub-pixel 232 sequentially through the third sub-pixel 236, the second sub-pixel 234, and the first sub-pixel 232 that are serially connected.

Note that the serial connection between the first sub-pixel 232 and the second sub-pixel 234 or the serial connection between the second sub-pixel 234 and the third sub-pixel 236 can be appropriately adjusted based on product specifications (e.g., resolution, dimension, and so on), design demands (e.g., turned-on time of the scan lines, conductivity of the data lines, time of writing data, properties of the transistors, and so on), or fabrication requirements (e.g. line width of the scan lines and the data lines, thickness of the pixel electrodes, and so on). In particular, according to this embodiment, the first source 232S and the second drain 234D can be directly connected through a connection line 240 in the same second conductive layer. Certainly, the first source 232S and the second drain 234D can also be indirectly connected through different film layers, e.g., through another connection line which is in the first conductive layer as are the first conductive lines.

Besides, in this embodiment, the second source 234S is connected to the third drain 236D through the third pixel electrode 236P, for example, such that the aperture ratio of the pixels 230 can be increased. Here, the pixel electrode in each of the sub-pixels is connected to the drain of the corresponding transistor through a corresponding contact window 250.

In practice, a wire jumping area J similar to the contact window 250 can be additionally set in the third sub-pixel 236, such that the second source 234S of the second transistor 234T in the second sub-pixel 234 can be electrically connected to the third pixel electrode 236P of the third sub-pixel 236 through the wire jumping area J. Specifically, an interlayer design of the wire jumping area J in the third sub-pixel 236 is exemplified in FIG. 2B. Undoubtedly, the second source 234S can be directly connected to the third drain 236D. The electrical connection among the first, the second, and the third sub-pixels 232, 234, and 236 is not limited in the invention.

Figure 2B:
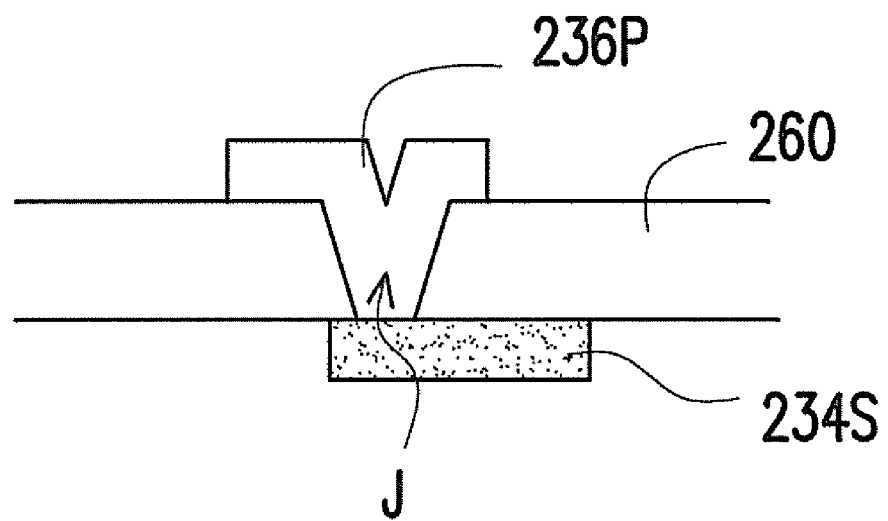
FIG. 2B is a schematic cross-sectional view illustrating a wire jumping area depicted in FIG. 2A.

The interlayer design of the wire jumping area J is further described herein. As indicated in FIGS. 2A and 2B, the data lines S and the source and the drain of each of the sub-pixels are formed by the same second conductive layer, for example. Besides, the pixel electrode of each of the sub-pixels is, for example, formed by the third conductive layer located above the data lines S. In this embodiment, the wire jumping area J serially connecting the second sub-pixel 234 and the third sub-pixel 236 is formed by extending the second source 234S to the underside of the third pixel electrode 236P of the third sub-pixel 236 during fabrication of the data lines S and the source and the drain of each of the sub-pixels, for example. Next, a patterning process is performed on a passivation layer 260 covering the data lines S, such that an opening exposing the second source 234S that is extended to the underside of the third pixel electrode 236P is formed. After that, the third pixel electrode 236P is formed, and in the meantime the opening is filled with a transparent conductive material of the pixel electrode to form the wire jumping area J illustrated in FIG. 2B. Fabrication of the wire jumping area J is not limited in the invention. Through partial modifications of original photomasks, the wire jumping area can be formed by performing the existing manufacturing process and utilizing the existing materials, and the aperture ratio of the pixel array 200 can be further increased.

Figure 3A:
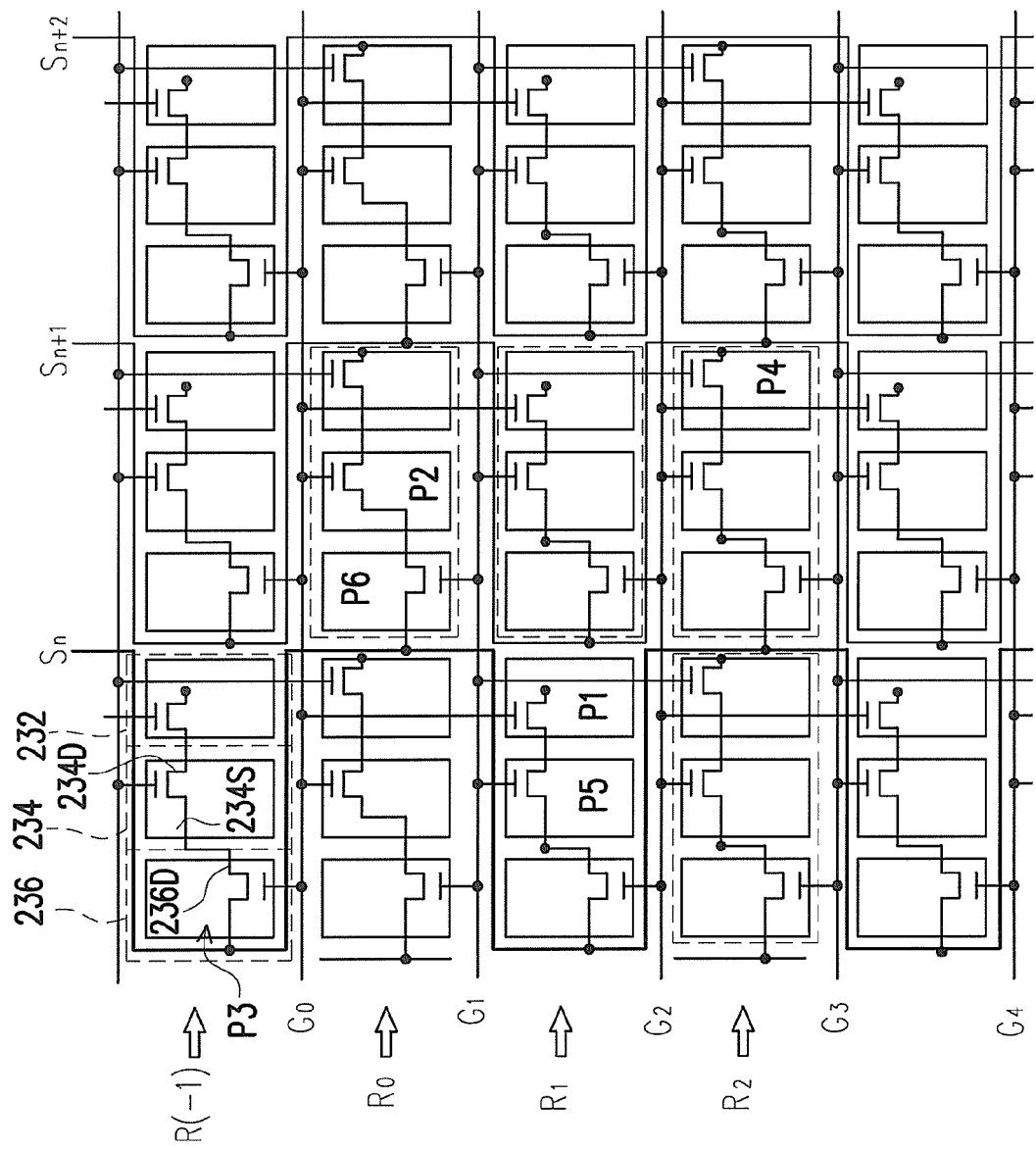
FIG. 3A is a schematic view illustrating the state of the pixel array depicted in FIG. 1 when a certain driving method is applied.
Figure 3B:
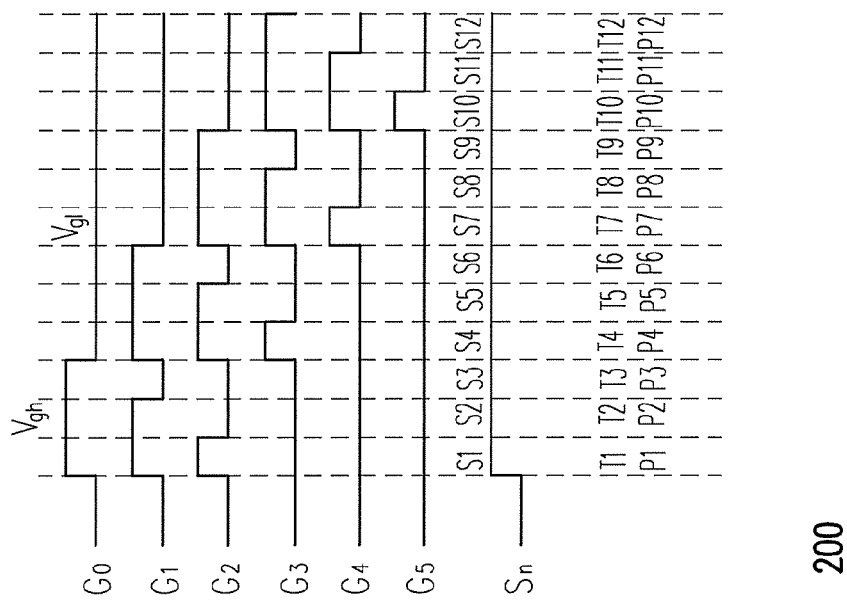
FIG. 3B is a schematic view illustrating driving waveforms of the pixel array depicted in FIG. 3A.

A driving method for the pixel array 200 shown in FIG. 1 is exemplified hereinafter with reference to FIGS. 3A and 3B. FIG. 3A is a schematic view illustrating the state of the pixel array depicted in FIG. 1 when a certain driving method is applied. FIG. 3B is a schematic view illustrating a driving signal of each of the sub-pixels in the pixel array 200 depicted in FIG. 1 within a certain frame time. Actual display information of the sub-pixels is sequentially written into corresponding data signals according to the order of P1~P6 as shown in FIG. 3A. Besides, in FIG. 3B, driving waveforms of the scan lines G and the data lines S within a certain frame time are illustrated.

Please refer to FIG. 3A. In this embodiment, the first source 232S of the first sub-pixel 232 is electrically connected to the second drain 234D of the second sub-pixel 234, and the second source 234S of the second sub-pixel 234 is electrically connected to the third drain 236D of the third sub-pixel 236. Therefore, within a first time frame T1, voltages at scan lines $G_0$, $G_1$, and $G_2$ are defined to be at the conductive voltage level $V_{gh}$, and the first, the second, and the third sub-pixels 232, 234, and 236 connected to the $n^{th}$ data line $S_n$ and arranged in the row $R_1$ are respectively turned on by the voltages at the conductive voltage level $V_{gh}$ applying to the scan lines $G_0$, $G_1$, and $G_2$ according to the above descriptions. Besides, the first data signal S1 transmitted through the data line $S_n$ is input to the first pixel electrode 232P sequentially through the turned-on third sub-pixel 236, the turned-on second sub-pixel 234 and the turned-on first transistor 232T in the row $R_1$. Thereby, within the first time frame T1, the signal to be used for display is written into the first sub-pixel 232 in the row $R_1$, and the first sub-pixel 232 is labeled as a first display pixel P1. In other words, within the first time frame T1, the first, the second, and the third sub-pixels 232, 234, and 236 in the row $R_1$ are connected to the $n^{th}$ data line $S_n$ and are equipotential. It should be mentioned that the second and the third sub-pixels 234 and 236 serve to transmit the first data signal S1 to the first sub-pixel 232, and thereby the second and the third sub-pixels 234 and 236 can also be pre-charged during the first time frame T1. As such, based on the corresponding time sequence, the corresponding data signal can be input again because of the rapid charging speed.

Next, as indicated in FIGS. 3A and 3B, the voltage at the scan line $G_2$ is converted to be at the non-conductive voltage level $V_{gl}$ within the second time frame T2, while the voltages at the scan lines $G_0$ and $G_1$ remain at the conductive voltage level $V_{gh}$. Thereby, the sub-pixel connected to the scan line $G_2$ is turned off, e.g., the third sub-pixel 236 in the row $R_1$. During the second time frame T2, the third sub-pixel 236 and the second sub-pixel 234 arranged in the row $R_0$ and connected to the data line $S_n$ can be respectively turned on by the voltages at the conductive voltage level $V_{gh}$ applying to the scan lines $G_0$ and $G_1$. Besides, the second data signal S2 transmitted through the data line $S_n$ is input to the corresponding second pixel electrode 234P sequentially through the turned-on third sub-pixel 236 and the turned-on second transistor 234T in the row $R_0$. Thereby, within the second time frame T2, the signal to be used for display is written into the second sub-pixel 234 connected to the data line $S_n$ and arranged in the row $R_0$, and the second sub-pixel 234 is labeled as a second display pixel P2.

After that, as indicated in FIGS. 3A and 3B, the voltage at the scan line $G_1$ is also converted to be at the non-conductive voltage level $V_{gl}$ within the third time frame T3, while only the voltage at the scan line $G_0$ remains at the conductive voltage level $V_{gh}$. Thereby, the sub-pixel connected to the scan lines $G_1$ and $G_2$ is turned off, e.g., the third sub-pixel 236 in the row $R_0$. During the third time frame T3, the third sub-pixel 236 arranged in the row $R_{(-1)}$ and connected to the data line $S_n$ can be turned on by the voltage at the conductive voltage level $V_{gh}$ applying to the scan line $G_0$. Besides, the third data signal S3 transmitted through the data line $S_n$ is input to the corresponding third pixel electrode 236P through the turned-on third transistor 236T in the row $R_{(-1)}$. Thereby, within the third time frame T3, the signal to be used for display is written into the third sub-pixel 236 connected to the data line $S_n$ and arranged in the row $R_{(-1)}$, and the third sub-pixel 236 is labeled as a third display pixel P3.

Likewise, the driving mechanism within a fourth time frame T4 is similar to that within the first time frame T1, i.e., three successive scan lines G are turned on. Nonetheless, within the fourth time frame T4, the scan lines G to which the conductive voltage level $V_{gh}$ is applied are defined as the three scan lines $G_1$, $G_2$, and $G_3$ of the next group. Here, the first sub-pixel 232, the second sub-pixel 234, and the third sub-pixel 236 in the row $R_2$ are turned on. Accordingly, in the fourth time frame T4, the fourth data signal S4 to be used for display is written into the first sub-pixel 232 in the row $R_2$, and the first sub-pixel 232 is labeled as a fourth display pixel P4. The operation in the fourth time frame T4 is similar to that in the first time frame T1, and therefore no further description is provided herein.

Based on the above, in the following fifth time frame T5, the fifth data signal S5 to be used for display is written into the second sub-pixel 234 in the row $R_1$, and the second sub-pixel 234 is labeled as a fifth display pixel P5. In the following sixth time frame T6, the sixth data signal S6 to be used for display is written into the third sub-pixel 236 in the row $R_0$, and the third sub-pixel 236 is labeled as a sixth display pixel P6. The operation in the fifth and the sixth time frames T5 and T6 is similar to that in the second and the third time frames T2 and T3, and therefore no further description is provided herein. As a result, the scan lines G of the pixel array 200 in the invention are individually grouped according to the time sequence, and the voltages at the conductive voltage level $V_{gh}$ and the non-conductive voltage level $V_{gl}$ are input to different sub-pixels for displaying images. Likewise, as indicated in FIG. 3B, in the subsequent time sequence, e.g., the seventh time frame T7 to the twelfth time frame T12, corresponding data signals S7~S12 are respectively input, such that the pixel array 200 can display images by writing the corresponding data signals. The operation in the time frames T7~T12 is similar to that in the time frames T1~T6, and therefore no further description is provided herein. Moreover, the data signals S1~S12 depicted in FIG. 3B respectively represent the data signals transmitted within different time sequences. Practically, levels of the data signals S1~S12 can be the same or different, and the data signals S1~S12 in FIG. 3B have the same level, for example.

It should be mentioned that through the proper layout of the pixels 230 in the pixel array 200 of the embodiment, the three sub-pixels in each of the pixels 230 can share the same data line S to transmit different corresponding data signals in different time frames. Accordingly, the number of data lines S, the number of the source drivers, and the fabricating costs can all be reduced. Furthermore, in the above-enumerated driving mechanisms, it is likely not to convert the polarity of the data signals that are input to the same data line S as time passes by. Instead, by transmitting the data signals with different polarities to the adjacent data lines S, the pixels 230 in the same column can have the cyclically arranged positive polarity status and the negative polarity status because the pixels 230 connected to the same data line S in the column direction $D_C$ are not aligned. As such, the dot-inversion driving mode, e.g. a three-dot inversion, can be accomplished by applying the simple line-inversion driving method. That is to say, favorable display quality can be achieved by applying the driving method with low power consumption.

Second Embodiment

Figure 4:
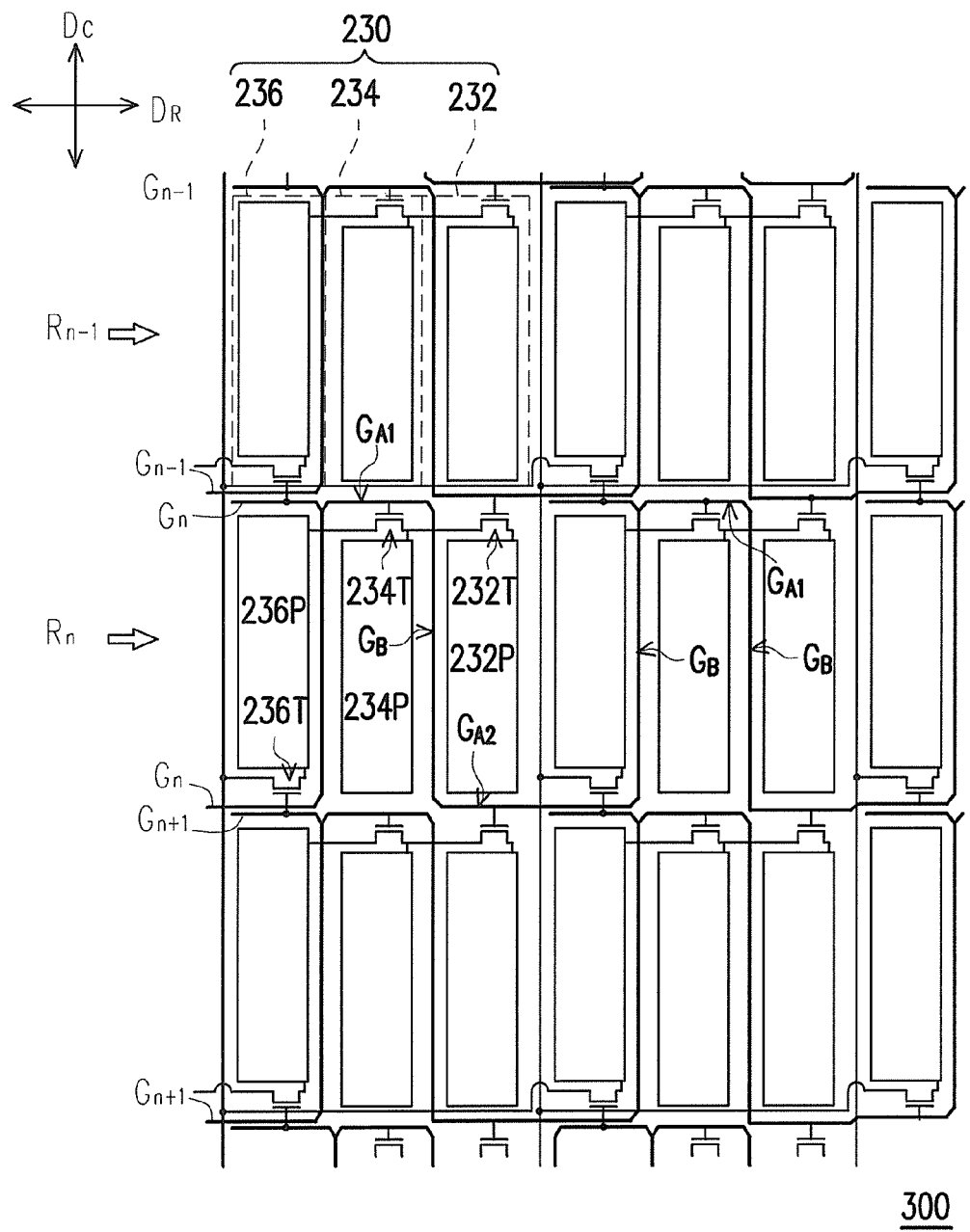
FIG. 4 is a schematic view illustrating a layout of a pixel array according to a second embodiment of the invention.

FIG. 4 is a schematic view illustrating a layout of a pixel array according to a second embodiment of the invention. Referring to FIG. 4, a pixel array 300 of the present embodiment is similar to the pixel array 200 of the first embodiment, and therefore elements similar to those of the first embodiment will be represented by the same reference numerals. The difference between the second embodiment and the first embodiment lies in that the wire routing design of the data lines S is changed to a linear design in the pixel array 300 of this embodiment, while the scan lines G of this embodiment have the wire routing design.

Specifically, according to this embodiment, in each of the pixels 230 arranged in the $n^{th}$ row $R_n$, the first transistor 232T, the first pixel electrode 232P, the second transistor 234T, the second pixel electrode 234P, the third transistor 236T, and the third pixel electrode 236P are all located between the $n^{th}$ scan line $G_n$ and the $(n+1)^{th}$ scan line $G_{n+1}$. Additionally, as depicted in FIG. 4, each of the scan lines G substantially has a sawtooth-shaped layout. Particularly, from a macroscopic perspective, each of the scan lines G substantially extends along the row direction $D_R$. By contrast, from a microscopic perspective, each of the scan lines G mainly contains a plurality of third conductive lines $G_A$ extending along the row direction $D_R$ and a plurality of fourth conductive lines $G_B$ extending along the column direction $D_C$, for example. Here, the third conductive lines $G_A$ and the fourth conductive lines $G_B$ are alternately connected to form the data lines S having the sawtooth-shaped layout, as shown in FIG. 4.

In FIG. 4, the fourth conductive lines $G_B$ are located at the left side and the right side of the second sub-pixel 234 in the same pixel 230 according to this embodiment. For instance, the fourth conductive lines $G_B$ in the row $R_n$ are located between the second sub-pixel 234 and the third sub-pixel 236 and between the second sub-pixel 234 and the first sub-pixel 232 in the same pixel 230. To be more specific, a length of each of the fourth conductive lines $G_B$ is substantially equal to the length of the first sub-pixel 232, the length of the second sub-pixel 234, or the length of the third sub-pixel 236, respectively. Besides, in each of the pixels 230 of this embodiment, the third conductive lines $G_A$ can be substantially divided into a first portion $G_{A1}$ having a length substantially equal to a width of one sub-pixel and a second portion $G_{A2}$ having a length substantially equal to the total width of two sub-pixels. Here, the fourth conductive lines $G_B$ in the same pixel 230 are connected through the first portion $G_{A1}$ of the third conductive lines $G_A$, and the fourth conductive lines $G_B$ between two adjacent pixels 230 are connected through the second portion $G_{A2}$ of the third conductive lines $G_A$. In the embodiment, note that the third conductive lines $G_A$ further extend from the fourth conductive line $G_B$ between the second sub-pixel 234 and the third sub-pixel 236 to the third sub-pixel 236 so as to form a branch. Thereby, the third gate 236G of the third sub-pixel 236 in the $(n-1)^{th}$ row $R_{n-1}$ is apt to be connected to the scan line $G_n$ through the branch.

Figure 5:
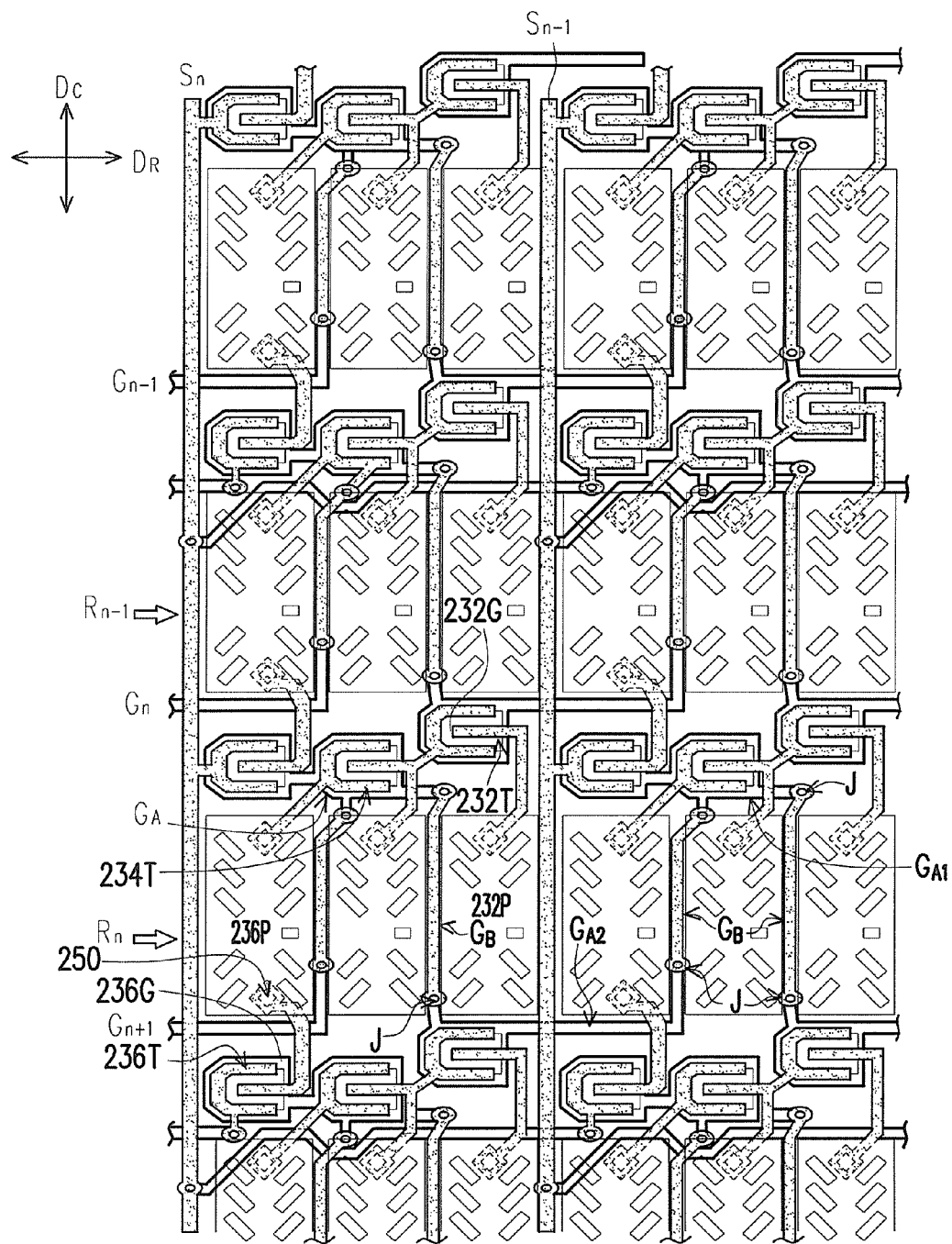
FIG. 5 is a schematic diagram further illustrating the specific layout of the pixel array depicted in FIG. 4.

FIG. 5 is a schematic diagram further illustrating the specific layout of the pixel array depicted in FIG. 4. In FIG. 5, the $n^{th}$ scan line $G_n$ includes the third conductive lines $G_A$ extending along the row direction $D_R$ and the fourth conductive lines $G_B$ extending along the column direction $D_C$, and the third conductive lines $G_A$ and the fourth conductive lines $G_B$ are alternately connected. Practically, the third conductive lines $G_A$ and the scan lines G can be made of the same material and formed by performing the same PEP. Besides, the fourth conductive lines $G_B$ and the data lines S can be made of the same material and formed by performing the same PEP.

As indicated in FIG. 5, the pixel 230 arranged in the $n^{th}$ row $R_n$ is taken for example, wherein the third gate 236G, the second gate 234G, and the first gate 232G are sequentially connected to the $(n+1)^{th}$ scan line $G_{n+1}$, the $n^{th}$ scan line $G_n$, and the $(n-1)^{th}$ scan line $G_{n-1}$. Besides, the second source 234S of the second sub-pixel 234 is indirectly and electrically connected to the data line $S_n$ through the third pixel electrode 236P. The first source 232S of the first sub-pixel 232 is directly connected to the second drain 234D of the second sub-pixel 234, and the first source 232S of the first sub-pixel 232 is indirectly and electrically connected to the data line $S_n$ through the third sub-pixel 236 and the second sub-pixel 234. Hence, in the first sub-pixel 232, the first data signal is transmitted to the first pixel electrode 232P of the first sub-pixel 232 sequentially through the third transistor 236T, the third pixel electrode 236P, the second transistor 234T, and the first transistor 232T.

Note that the serial connection between the first sub-pixel 232 and the second sub-pixel 234 or the serial connection between the second sub-pixel 234 and the third sub-pixel 236 can be designed based on different demands described in the first embodiment. According to this embodiment, the first source 232S and the second drain 234D can be directly connected through the same film layer. Certainly, the first source 232S and the second drain 234D can have the interlayer design of the wire jumping area J as described in the first embodiment. Likewise, the second source 234S can also be directly connected to the third drain 236D. The electrical connection among the first sub-pixel 232, the second sub-pixel 234, and the third sub-pixel 236 is not limited in the invention.

It should be mentioned that the connection between the third conductive lines $G_A$ and the fourth conductive lines $G_B$ in the present embodiment can be similar to the interlayer design of the aforesaid wire jumping area J. Besides, the third and the fourth conductive lines $G_A$ and $G_B$ and the data lines S can be made of the same material and formed by performing the same PEP. Particularly, during fabrication of the scan lines G and the gate of each of the sub-pixels, the third conductive lines $G_A$ are formed at predetermined positions. Next, when a gate insulation layer covering the scan lines G is patterned, an opening of the gate insulating layer exposing the third conductive lines $G_A$ is formed. After that, during fabrication of the data lines S and the source/drain in each of the transistors, the fourth conductive lines $G_B$ are formed at predetermined positions, and the opening is filled with a conductive material to form the wire jumping area J of the third and the fourth conductive lines $G_A$ and $G_B$.

Note that the number of data lines S, the number of source drivers, the fabricating costs, and power consumption can also be reduced by applying the pixel array 300 of this embodiment. Additionally, in comparison with the pixel array 200 of the first embodiment, the pixel array 300 of this embodiment is further conducive to improvement of the aperture ratio.

Moreover, the dot-inversion driving effect can also be achieved by performing the aforesaid driving method on the pixel array 300 of the second embodiment of the invention, and the operation in this embodiment is similar to that described in the first embodiment. Hence, no further description is provided hereinafter.

Third Embodiment

Figure 6:
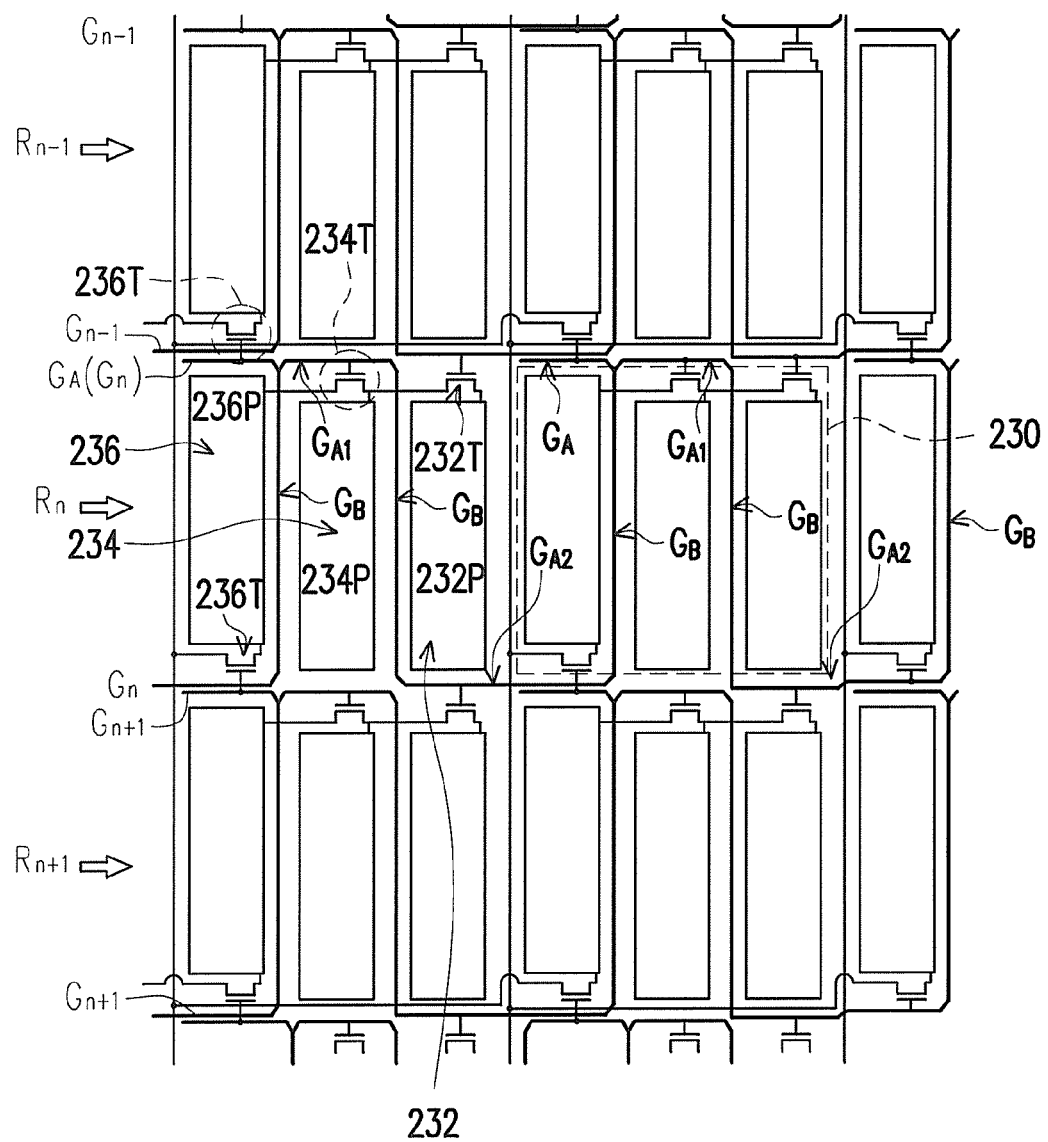
FIG. 6 is a schematic view illustrating a layout of a pixel array according to a third embodiment of the invention.

FIG. 6 is a schematic view illustrating a layout of a pixel array according to a third embodiment of the invention. As shown in FIG. 6, a pixel array 400 of the present embodiment is similar to the pixel array 300 of the second embodiment, and therefore elements similar to those of the second embodiment will be represented by the same reference numerals. The difference between the second embodiment and the present embodiment lies in that the design of transistors in the pixel array 400 of the present embodiment is different from that in the pixel array 300 of the second embodiment.

Specifically, as shown in FIG. 6 which is similar to FIG. 4 illustrating the second embodiment, in each of the pixels 230 arranged in the $n^{th}$ row $R_n$, the first transistor 232T, the first pixel electrode 232P, the second transistor 234T, the second pixel electrode 234P, the third transistor 236T, and the third pixel electrode 236P are all located between the $n^{th}$ scan line $G_n$ and the $(n+1)^{th}$ scan line $G_{n+1}$. Besides, a length of each of the fourth conductive lines $G_B$ is substantially equal to the length of the first sub-pixel 232, the length of the second sub-pixel 234, or the length of the third sub-pixel 236, respectively. Additionally, the fourth conductive lines $G_B$ are located between the first sub-pixel 232 and the second sub-pixel 234 and between the second sub-pixel 234 and the third sub-pixel 236 in the same pixel 230. Arrangement and design considerations of other components in this embodiment are similar to those in the second embodiment, and therefore no further description is provided herein.

Figure 7:
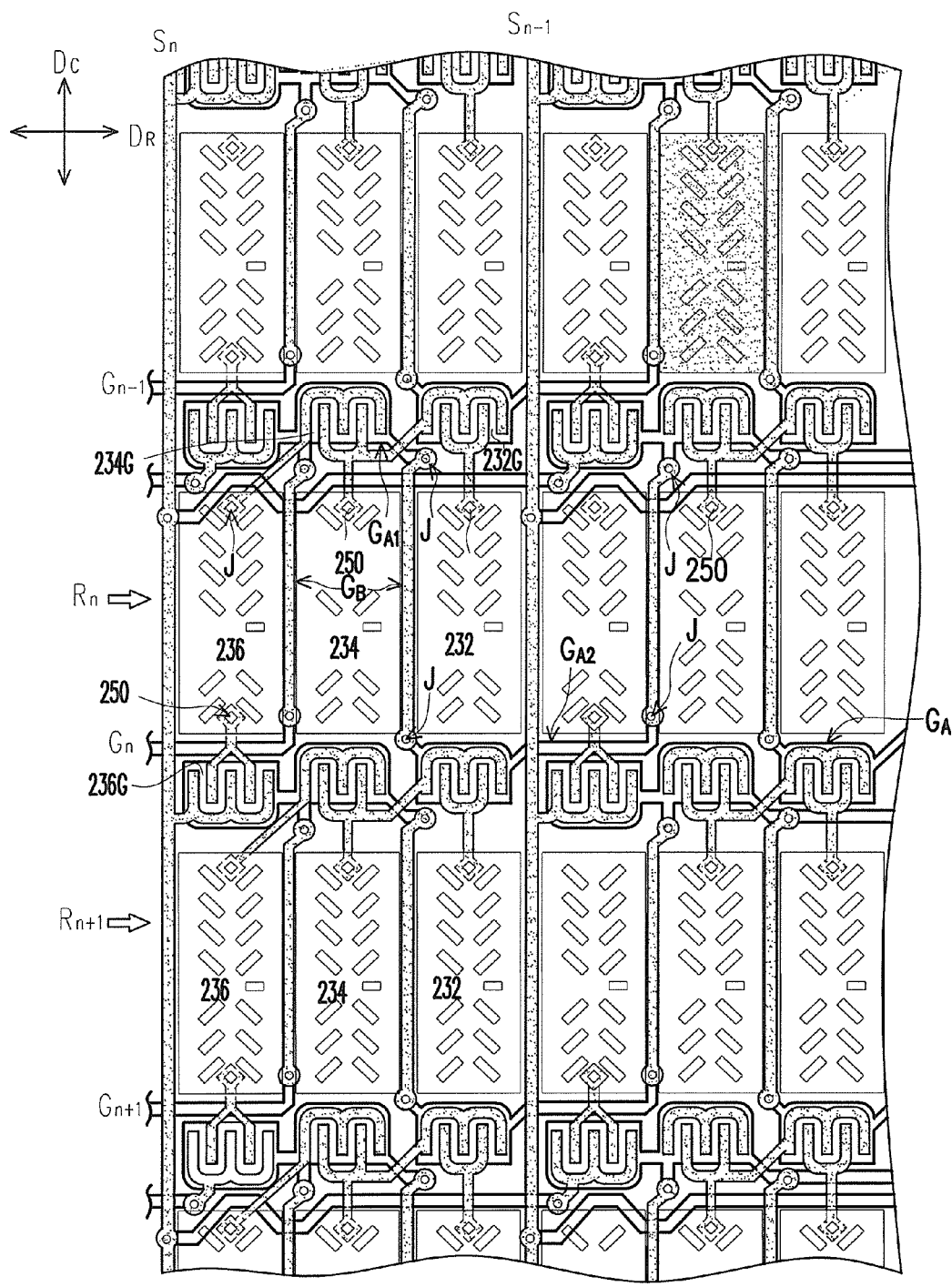
FIG. 7 is a schematic diagram further illustrating the specific layout of the pixel array depicted in FIG. 6.

FIG. 7 is a schematic diagram further illustrating the specific layout of the pixel array depicted in FIG. 6. In FIG. 7, the $n^{th}$ scan line $G_n$ includes the third conductive lines $G_A$ extending along the row direction $D_R$ and the fourth conductive lines $G_B$ extending along the column direction $D_C$, and the third conductive lines $G_A$ and the fourth conductive lines $G_B$ are alternately connected. Practically, the third conductive lines $G_A$ and the scan lines G can be made of the same material and formed by performing the same PEP. Besides, the fourth conductive lines $G_B$ and the data lines S can be made of the same material and formed by performing the same PEP.

The layout of the pixel array as depicted in FIG. 7 is similar to the layout of the pixel array as described in the second embodiment and depicted in FIG. 5, and no further description of the similar components is provided herein. The difference between the present embodiment and the first and the second embodiments rests in the design of the transistors. In particular, as indicated in FIG. 7, each drain of the transistor has two branches facing each source in each of the sub-pixels of the present embodiment. Thereby, within the limited layout, a ratio W/L of a width to a length of the transistor can be increased. Further, when the device properties of the transistors are improved, the aperture ratio of the pixels 230 is not affected by the increase in the width/length ratio W/L.

Note that the number of data lines S, the number of source drivers, the fabricating costs, and power consumption can also be reduced by applying the pixel array 400 of this embodiment. Additionally, in comparison with the pixel array 200 of the first embodiment, the pixel array 400 of this embodiment is further conducive to improvement of the aperture ratio.

Moreover, the dot-inversion driving effect can also be achieved by performing the aforesaid driving method of the first embodiment on the pixel array 400 of the third embodiment of the invention, and the operation in this embodiment is similar to that described in the first embodiment. Hence, no further description is provided hereinafter.

Fourth Embodiment

Figure 8:
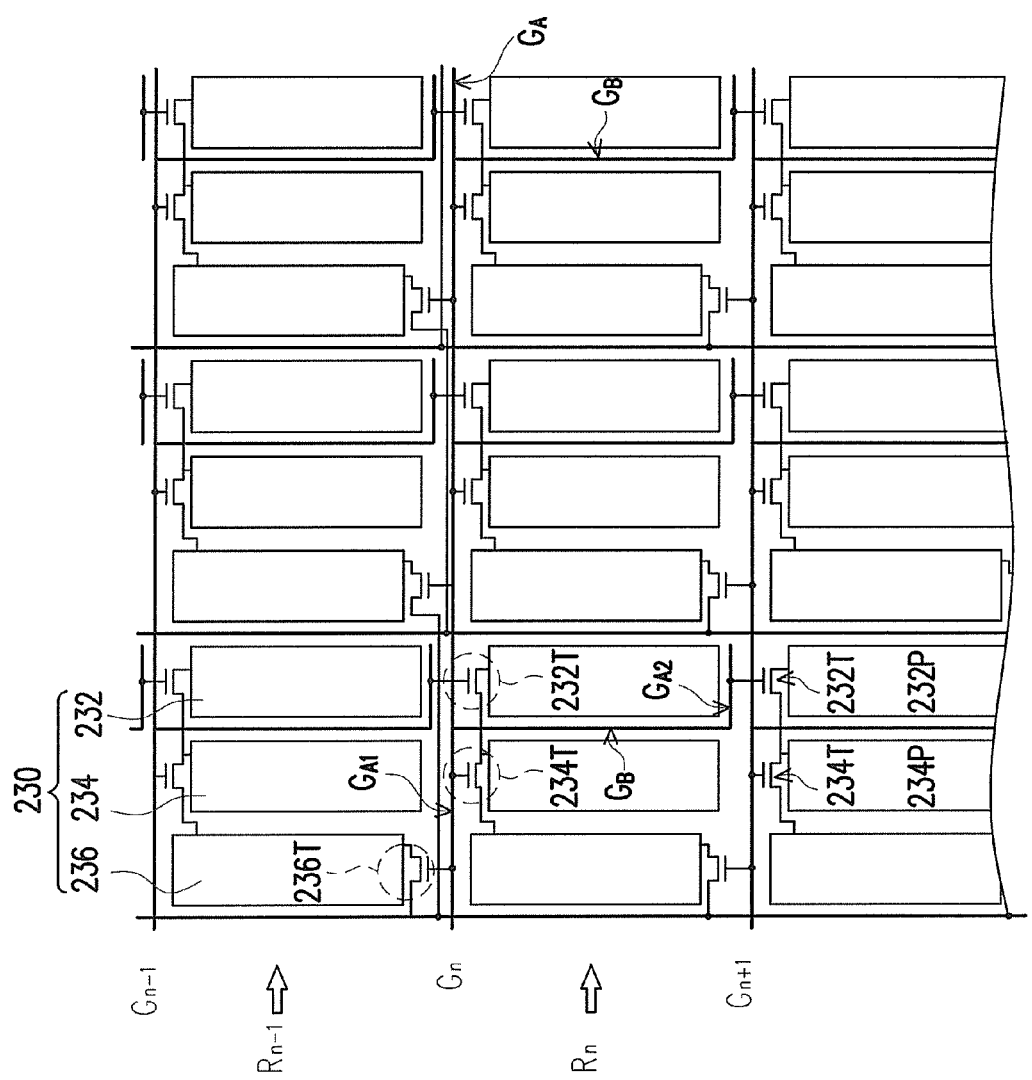
FIG. 8 is a schematic view illustrating a layout of a pixel array according to a fourth embodiment of the invention.

FIG. 8 is a schematic view illustrating a layout of a pixel array according to a fourth embodiment of the invention. In FIG. 8, a pixel array 500 of the present embodiment is similar to the pixel array 400 of the third embodiment, and therefore elements similar to those of the third embodiment will be represented by the same reference numerals. The difference between the third embodiment and the present embodiment lies in that the positions of the third conductive lines $G_A$ and the fourth conductive lines $G_B$ in the pixels 230 of the pixel array 500 are different from the positions of the third conductive lines $G_A$ and the fourth conductive lines $G_B$ in the pixels 230 of the pixel array 400.

Specifically, according to this embodiment, in each of the pixels 230 arranged in the $n^{th}$ row $R_n$, the first transistor 232T, the first pixel electrode 232P, the second transistor 234T, the second pixel electrode 234P, the third transistor 236T, and the third pixel electrode 236P are all located between the $n^{th}$ scan line $G_n$ and the $(n+1)^{th}$ scan line $G_{n+1}$. Besides, in this embodiment, note that the third conductive lines $G_A$ can be substantially divided into a first portion $G_{A1}$ and a second portion $G_{A2}$ extending along the row direction $D_R$, and the first portion $G_{A1}$ and the second portion $G_{A2}$ of the third conductive lines $G_A$ are respectively located at two sides of the pixel 230. In addition, the fourth conductive lines $G_B$ substantially extend along the column direction $D_C$. As for the same scan line G, the first portion $G_{A1}$ of the third conductive lines $G_A$ is electrically connected to the third sub-pixel 236 of the pixel 230 in the previous row and electrically connected to the second sub-pixel 234 of the pixel 230 in the present row, while the second portion $G_{A2}$ of the third conductive lines $G_A$ is electrically connected to the first sub-pixel 232 of the pixel 230 in the next row.

For instance, with respect to the $n^{th}$ scan line $G_n$, the first portion $G_{A1}$ of the third conductive lines $G_A$ is electrically connected to the third transistor 236T located in the $(n-1)^{th}$ row $R_{n-1}$ and electrically connected to the second transistor 234T located in the $n^{th}$ row $R_n$. Namely, in the pixel 230 arranged in the $n^{th}$ row $R_n$ located between the $n^{th}$ scan line $G_n$ and the $(n+1)^{th}$ scan line $G_{n+1}$, the third transistor 236T of the third sub-pixel 236, the second transistor 234T of the second sub-pixel 234, and the first transistor 232T of the first sub-pixel 232 are electrically connected to the scan lines $G_{n+1}$, $G_n$, and $G_{n-1}$, respectively.

In this embodiment, the first portion $G_{A1}$ and the second portion $G_{A2}$ of the third conductive lines $G_A$ located at the two sides of the pixel 230 are connected to each other through each of the fourth conductive lines $G_B$. Note that the fourth conductive lines $G_B$ are arranged between the second sub-pixel 234 and the first sub-pixel 232, extended from the first portion $G_{A1}$ of the third conductive lines $G_A$ to the next scan line along the column direction $D_C$, and connected to the second portion $G_{A2}$ of the third conductive lines $G_A$. It should be mentioned that the above-mentioned interlayer design of the wire jumping area J can be applied to the connection between each of the fourth conductive lines $G_B$ and the first and the second portions $G_{A1}$ and $G_{A2}$ of the third conductive lines $G_A$.

Figure 9:
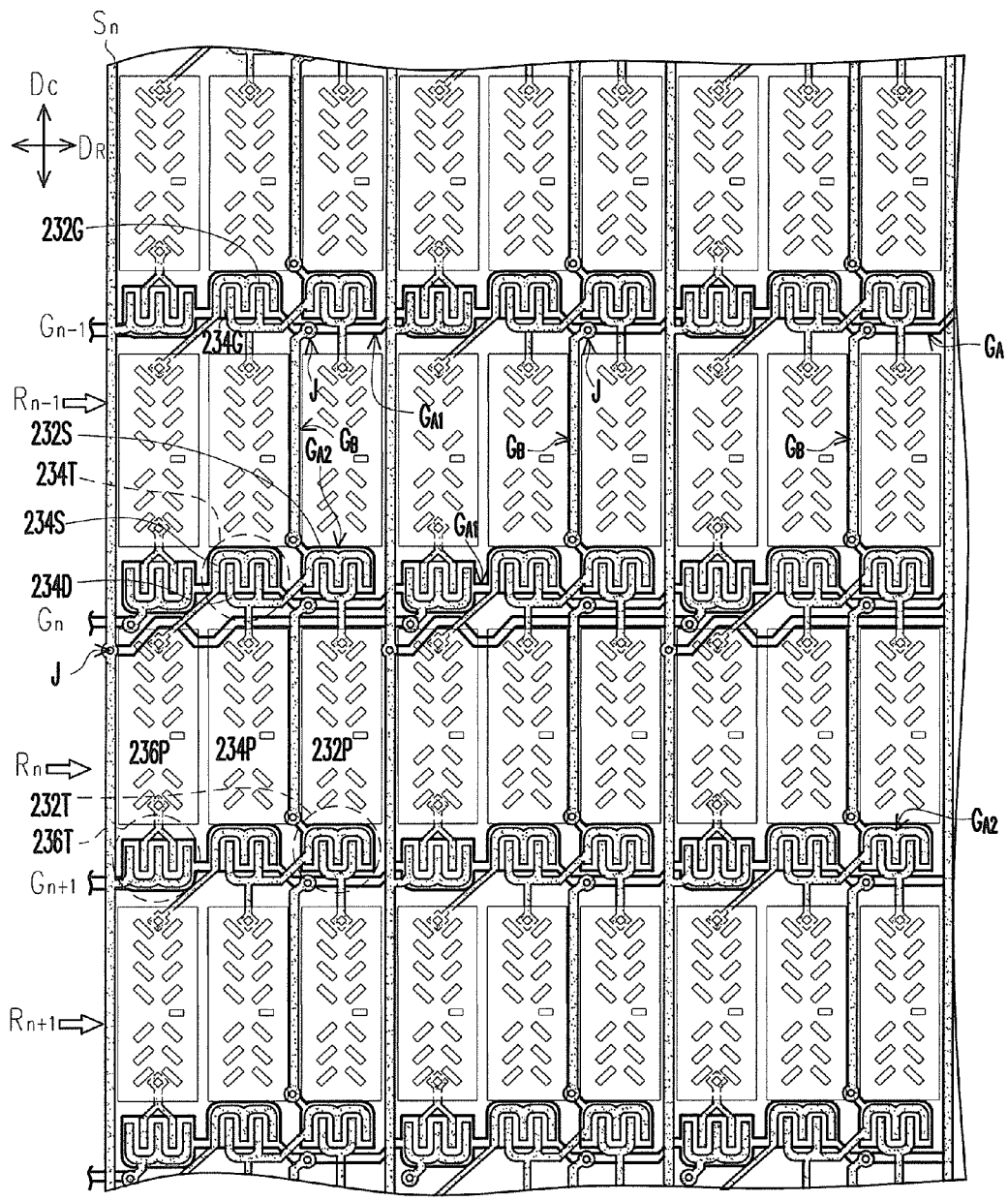
FIG. 9 is a schematic diagram further illustrating the specific layout of the pixel array depicted in FIG. 8.

FIG. 9 is a schematic diagram further illustrating the specific layout of the pixel array depicted in FIG. 8. As shown in FIG. 9, the $n^{th}$ scan line $G_n$ includes the first portion $G_{A1}$ and the second portion $G_{A2}$ of the third conductive lines $G_A$ extending along the row direction $D_R$ and the fourth conductive lines $G_B$ extending along the column direction $D_C$. The first portion $G_{A1}$ of the third conductive lines $G_A$ substantially extends along the scan line. Besides, the first portion $G_{A1}$ of the third conductive lines $G_A$ is electrically connected to the third sub-pixel 236 in the pixel 230 located in the previous row $R_{n-1}$ and electrically connected to the second sub-pixel 234 in the pixel 230 located in the present row $R_n$. The second portion $G_{A2}$ of the third conductive lines $G_A$ is connected to the first sub-pixel 232 in the pixel 230 located in the next row $R_{n+1}$. The fourth conductive lines $G_B$ are connected between the first portion $G_{A1}$ and the second portion $G_{A2}$ of the third conductive lines $G_A$. Practically, the third conductive lines $G_A$ and the scan lines G can be made of the same material and formed by performing the same PEP. Besides, the fourth conductive lines $G_B$ and the data lines S can be made of the same material and formed by performing the same PEP.

As indicated in FIG. 9, the pixel 230 arranged in the $n^{th}$ row $R_n$ is taken for example, wherein the third gate 236G, the second gate 234G, and the first gate 232G are sequentially connected to the $(n+1)^{th}$ scan line $G_{n+1}$, the $n^{th}$ scan line $G_n$, and the $(n-1)^{th}$ scan line $G_{n-1}$, respectively. Besides, the second source 234S of the second sub-pixel 234 is indirectly and electrically connected to the data line $S_n$ through the third pixel electrode 236P. The first source 232S of the first sub-pixel 232 is directly connected to the second drain 234D of the second sub-pixel 234, and the first source 232S of the first sub-pixel 232 is indirectly and electrically connected to the data line $S_n$ through the third sub-pixel 236 and the second sub-pixel 234. Hence, in the first sub-pixel 232, the first data signal is transmitted to the first pixel electrode 232P of the first sub-pixel 232 sequentially through the third transistor 236T, the third pixel electrode 236P, the second transistor 234T, and the first transistor 232T.

Note that the serial connection between the first sub-pixel 232 and the second sub-pixel 234 or the serial connection between the second sub-pixel 234 and the third sub-pixel 236 can be designed based on different demands described in the previous embodiments. According to this embodiment, the first source 232S and the second drain 234D can be directly connected through the same film layer. Certainly, the first source 232S and the second drain 234D can have the wire jumping design described in the first embodiment. In addition, the second source 234S can also be directly connected to the third drain 236D. The electrical connection among the first sub-pixel 232, the second sub-pixel 234, and the third sub-pixel 236 is not limited in the invention. Likewise, the serial connection between the third conductive lines $G_A$ and the fourth conductive lines $G_B$ can have the interlayer design of the wire jumping area as described in the second embodiment, and therefore no further description is provided herein.

Note that the number of data lines S, the number of source drivers, the fabricating costs, and power consumption can also be reduced by applying the pixel array 500 of this embodiment. Additionally, in comparison with the pixel array 200 of the first embodiment, the pixel array 500 of this embodiment is further conducive to improvement of the aperture ratio.

It should be mentioned that the design of the transistors in this embodiment is similar to that in the third embodiment. Each drain of the transistor has two branches facing each source in each of the sub-pixels of the present embodiment. Thereby, within the limited layout, a ratio W/L of a width to a length of the transistor can be increased. Further, when the device properties of the transistors are improved, the aperture ratio of the pixels 230 is not affected by the increase in the width/length ratio W/L.

Moreover, the dot-inversion driving effect can also be achieved by performing the aforesaid driving method of the first embodiment on the pixel array 500 of the fourth embodiment of the invention, and the operation in this embodiment is similar to that described in the first embodiment. Hence, no further description is provided hereinafter.

Fifth Embodiment

Figure 10:
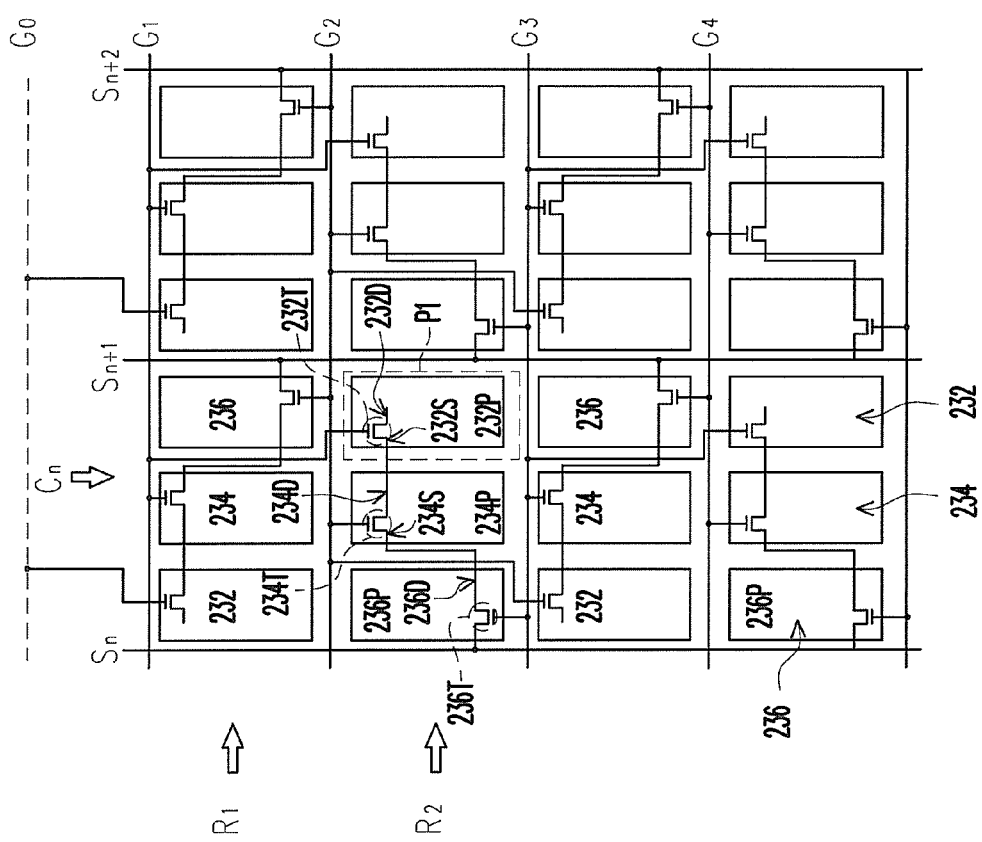
FIG. 10 is a schematic view illustrating a layout of a pixel array according to a fifth embodiment of the invention.

FIG. 10 is a schematic view illustrating a layout of a pixel array according to a fifth embodiment of the invention. In FIG. 10, a pixel array 600 of the present embodiment is similar to the pixel array 500 of the fourth embodiment, and therefore elements similar to those of the third embodiment will be represented by the same reference numerals. In comparison with the fourth embodiment, the present embodiment provides the pixel array 600 having scan lines arranged in a linear manner. Note that among the pixels 230 located in the same column $C_n$, the pixels 230 in odd rows are electrically connected to the data line $S_{n+1}$, and the pixels 230 in even rows are electrically connected to the data line $S_n$.

Specifically, according to this embodiment, the third sub-pixel 236, the second sub-pixel 234, and the first sub-pixel 232 are sequentially arranged from left to right in each of the pixels 230 located in the second row $R_2$. Additionally, the first transistor 232T, the first pixel electrode 232P, the second transistor 234T, the second pixel electrode 234P, the third transistor 236T, and the third pixel electrode 236P are all located between the second scan line $G_2$ and the third scan line $G_3$. Moreover, the third gate 236G, the second gate 234G, and the first gate 232G are sequentially connected to the third scan line $G_3$, the second scan line $G_2$, and the first scan line $G_1$.

On the other hand, the first sub-pixel 232, the second sub-pixel 234, and the third sub-pixel 236 are sequentially arranged from left to right in each of the pixels 230 located in the first row $R_1$. The first transistor 232T, the first pixel electrode 232P, the second transistor 234T, the second pixel electrode 234P, the third transistor 236T, and the third pixel electrode 236P are all located between the first scan line $G_1$ and the second scan line $G_2$. Moreover, the third gate 236G, the second gate 234G, and the first gate 232G are sequentially connected to the second scan line $G_2$, the first scan line $G_1$, and the $0^{th}$ scan line $G_0$, respectively. Similarly, the number of data lines S, the number of source drivers, the fabricating costs, and power consumption can also be reduced by applying the pixel array 600 of this embodiment. Additionally, in comparison with the pixel array 200 of the first embodiment, the pixel array 600 of this embodiment is further conducive to improvement of the aperture ratio.

In light of the foregoing, the number of data lines can be significantly reduced by ⅔, and thereby the number of source drivers and the fabricating costs can also be reduced. As such, the flat panel displays applying this pixel array are more competitive. From another perspective, display effects similar to the dot-inversion driving mode can be achieved by performing a simple driving method according to the invention. In other words, satisfactory display quality is accomplished by a driving method with low power consumption, and products with favorable quality can be manufactured with low costs.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A pixel array, comprising:
    a plurality of scan lines;
    a plurality of data lines intersecting the scan lines;
    a plurality of pixels connected to the scan lines and the data lines, each of the pixels arranged in an $n^{th}$ row comprising:
        a first sub-pixel comprising a first transistor and a first pixel electrode, wherein a first gate of the first transistor is connected to an $(n-1)^{th}$ scan line, and a first drain of the first transistor is connected to the first pixel electrode
        a second sub-pixel comprising a second transistor and a second pixel electrode, wherein a second gate of the second transistor is connected to an $n^{th}$ scan line, and a second drain of the second transistor is connected to the second pixel electrode and a first source of the first transistor; and
        a third sub-pixel comprising a third transistor and a third pixel electrode, wherein a third gate of the third transistor is connected to an $(n+1)^{th}$ scan line, a third drain of the third transistor is connected to the third pixel electrode and a second source of the second transistor, and a third source of the third transistor is connected to one of the data lines.

2. The pixel array as claimed in claim 1, wherein the pixels together connected to one of the data lines are distributed at the same side of the one of the data lines.

3. The pixel array as claimed in claim 1, wherein each of the data lines extends along a column direction in a zigzag manner, and each of the data lines comprises:
    a plurality of first conductive lines extending along a row direction; and
    a plurality of second conductive lines extending along the column direction, wherein the first conductive lines and the second conductive lines are alternately connected.

4. The pixel array as claimed in claim 1, wherein the first source is directly connected to the second drain.

5. The pixel array as claimed in claim 1, wherein the second source is connected to the third drain through the third pixel electrode.

6. The pixel array as claimed in claim 1, wherein each of the scan lines extends along a row direction in a zigzag manner, and each of the scan lines comprises:
    a plurality of third conductive lines extending along the row direction; and
    a plurality of fourth conductive lines extending along a column direction, wherein the third conductive lines and the fourth conductive lines are alternately connected.

7. The pixel array as claimed in claim 3, wherein a length of each of the first conductive lines is equal to a width of one of the pixels, and a length of each of the second conductive lines is equal to a length of one of the pixels.

8. The pixel array as claimed in claim 3, wherein among the pixels arranged in the same column, some of the pixels arranged in odd rows are connected to one of the data lines, and the other pixels arranged in even rows are connected to another one of the data lines.

9. The pixel array as claimed in claim 3, wherein in each of the pixels arranged in the $n^{th}$ row, the first pixel electrode, the second transistor, the second pixel electrode, the third transistor, and the third pixel electrode are located between the $n^{th}$ scan line and the $(n+1)^{th}$ scan line, and the first transistor is located between the $n^{th}$ scan line and the $(n-1)^{th}$ scan line.

10. The pixel array as claimed in claim 6, wherein the fourth conductive lines are located between the first sub-pixel and the second sub-pixel and between the second sub-pixel and the third sub-pixel in the same pixel.

11. The pixel array as claimed in claim 6, wherein the fourth conductive lines are located between the second sub-pixel and the first sub-pixel in the same pixel.

12. The pixel array as claimed in claim 6, wherein in each of the pixels arranged in the $n^{th}$ row, the first transistor, the first pixel electrode, the second transistor, the second pixel electrode, the third transistor, and the third pixel electrode are located between the $n^{th}$ scan line and the $(n+1)^{th}$ scan line.

* * * * *